(12) United States Patent
Yamaguchi et al.

(10) Patent No.: US 6,690,108 B2
(45) Date of Patent: Feb. 10, 2004

(54) ORGANIC ELECTROLUMINESCENCE ELEMENT AND MANUFACTURING METHOD THEREFOR

(75) Inventors: Yoshikazu Yamaguchi, Tokyo (JP); Shinichi Fukuzawa, Tokyo (JP)

(73) Assignee: NEC Corporation (JP)

( * ) Notice: Subject to any disclaimer, the term of this patent is extended or adjusted under 35 U.S.C. 154(b) by 131 days.

(21) Appl. No.: 09/899,352

(22) Filed: Jul. 5, 2001

(65) Prior Publication Data

US 2002/0003402 A1 Jan. 10, 2002

(30) Foreign Application Priority Data

Jul. 7, 2000 (JP) ...................... P2000-207463

(51) Int. Cl.$^7$ .............................................. H01J 63/04
(52) U.S. Cl. ...................................... 313/504; 313/509
(58) Field of Search ............................... 313/504, 509; 428/690, 917

(56) References Cited

U.S. PATENT DOCUMENTS 5,445,899 A * 8/1995 Budzilek et al. ............ 428/690
5,814,417 A * 9/1998 Nagayama .................. 428/690

FOREIGN PATENT DOCUMENTS

| JP | 3-250583 | 11/1991 | .......... H05B/33/22 |
| JP | 7-118387 | 12/1995 | .......... H05B/33/12 |
| JP | 11-121178 | 4/1999 | .......... H05B/33/22 |

* cited by examiner

*Primary Examiner*—Thomas M. Sember
*Assistant Examiner*—Sumati Krishnan
(74) *Attorney, Agent, or Firm*—Hayes Soloway P.C.

(57) ABSTRACT

The present invention provides an organic EL element and a manufacturing method therefor, which can reduce the number of steps and the cost required for manufacturing the organic EL element, and which can improve the reliability of the organic EL element, by preventing a short circuit, the breaking of a cathode, and the like. The organic EL element includes a plurality of transparent electrodes arranged in parallel on a base plate, a plurality of cathodes disposed above organic layers so as to cross the transparent electrodes, organic layers including light emission layers and disposed between the transparent electrodes and the cathodes, and an insulating organic layer disposed in spaces between adjacent transparent electrodes. The manufacturing method includes the steps of forming the transparent electrode, the insulating organic layer, the organic layer, and the cathode, which are carried out in a vacuum state.

13 Claims, 4 Drawing Sheets

ORGANIC ELECTROLUMINESCENCE ELEMENT AND MANUFACTURING METHOD THEREFOR

BACKGROUND OF THE INVENTION

1. Field of the Invention

The present invention relates to an organic electroluminescence (organic EL) element and a manufacturing method therefor.

2. Description of the Related Art

An electroluminescence element (EL element) is a solid element which has high impact resistance and emits lights with high visibility. The use of an EL element as a light emitting element has been attempted in various display devices. Especially, organic EL elements have been recently developed which have structures such as the following:

cathode/light emission layer/hole injection layer/anode;

cathode/electron injection layer/light emission layer/anode;

cathode/electron injection layer/light emission layer/hole injection layer/anode; or anode/light emission layer/electron injection layer/cathode. The organic EL elements show various superior properties, such as the capability to emit light with high brightness and high efficiency by merely applying a voltage between the cathode and the anode, and the capability to show multicolor.

Figure 5:
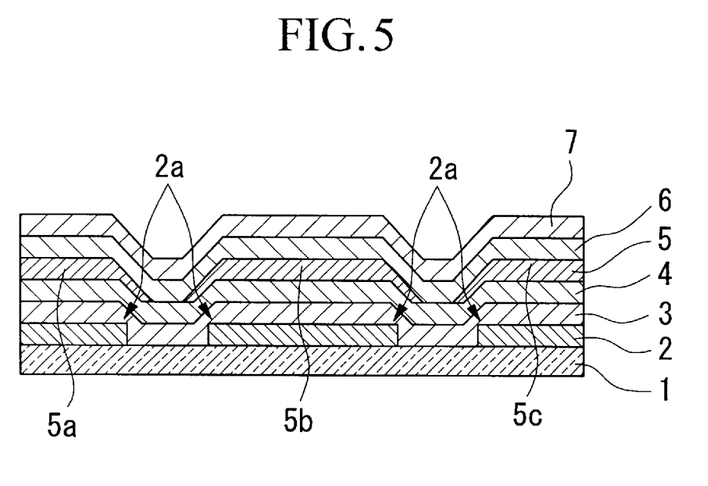
FIG. 5 is a cross-sectional view showing an organic EL element according to the prior art.

As shown in FIG. 5, an example of the organic EL element is formed by laminating, on a glass substrate 1, transparent electrodes 2 as anodes, an organic EL layer consisting of a hole injection layer 3, a hole transport layer 4, light emission layers 5, an electron transport layer 6, and a cathode 7, in the above order.

The transparent electrodes (anodes) 2 are generally made of indium tin oxide (ITO). The cathode 7 is made of an alloy or a mixture of magnesium and a group II metal.

The light emission layers 5 are provided between the anodes 2 and the cathode 7. The light emission layers 5 are formed respectively into patternings of a red light emission layer 5a, a green light emission layer 5b, and a blue light emission layer 5c. Moreover, the hole injection layer 3, the hole transport layer 4, and the electron transport layer 6 are provided in that order between the anodes 2 and the cathode 7, so that the organic EL element can emit light with high brightness and high efficiency.

When a voltage is applied between the anodes 2 and the cathode 7, the light emission layers 5 of the organic EL element emit light. Each layer of the organic EL element has a thickness of 200 nm or less, except for the insulating organic layers 18 and the cathode 7.

In the organic EL element shown in FIG. 5, the anodes 2 are formed into a patterning over a glass substrate 1 by using a photolithography technique, followed by forming films of a hole injection layer 3, a hole transport layer 4, light emission layers 5, an electron transport layer 6, and a cathode 7, in that order.

However, when the anodes 2 are made of ITO, the workability of the patterning becomes low. For example, when the wet etching technique is used to improve productivity, both pattern edges 2a, 2a of the anode 2 made of ITO become rough and form taper angles of 15 to 90°, on which the hole injection layer 3, the hole transport layer 4, and the electron transport layer 6 are then respectively formed into films, in that order. Therefore, the thicknesses of the hole injection layer 3, the hole transport layer 4, and the electron transport layer 6 become irregular, generating thin or convex portions on which local film damage is caused by an applied voltage, and a short circuit is caused by a concentration of an electrical field. Thereby, the cathode 7, which was last to be formed into a film, is in danger of being cut, resulting in a decrease in the reliability of the organic EL element.

In order to prevent the generation of a short circuit and the breaking of the cathode 7, a method, in which an insulating material is provided between opposite electrodes, is disclosed in Japanese Patent No. 2734464.

However, in the method of providing the insulating material between the opposite electrodes, in addition to an evaporation apparatus, other filmforming apparatuses, patternforming apparatuses, and the like, are required, so that the number of processes and the required cost for manufacturing the organic EL element increase.

When polyimide is used as the insulating material and is formed into a film between the opposite electrodes using spin coating techniques, for example, dark spots, which darken the light emission areas, are increased due to a small quantity of moisture included in the polyimide film.

SUMMARY OF THE INVENTION

The present invention has been made to solve the problems described above. An object of the present invention is to provide an organic EL element which can be produced at low cost and which can improve the reliability by preventing problems such as the generation of a short circuit and the breaking of a cathode thereof, and to provide a manufacturing method therefor.

The present invention provides an organic EL element including a plurality of transparent electrodes arranged in parallel on a base plate; a plurality of cathodes disposed above organic layers so as to cross the transparent electrodes; said organic layers including light emission layers and disposed between the transparent electrodes and the cathodes; and an insulating organic layer disposed in spaces between adjacent transparent electrodes. The insulating organic layers may comprise overhanging portions to cover the lateral end portions of the transparent electrodes. The overhanging portion may have a taper angle at each lateral end thereof, and the thickness of the overhanging portion decreases from the inside to the outside of the insulating organic layers in the width direction of the insulating organic layer. The taper angle of the overhanging portion may be set within the range of 0.01 to 70°.

The maximum film thickness of the insulating organic layer may be set within the range of 10 to 500 nm. The widths of the overhanging portions may be set within the range of 1 to 15 $\mu$m. The insulating organic layer is made of at least one material used for the organic layer.

Moreover, the present invention provides a manufacturing method of an organic EL element comprising a plurality of transparent electrodes arranged in parallel on a base plate; a plurality of cathodes disposed above organic layers so as to cross the transparent electrodes; said organic layers including light emission layers and disposed between the transparent electrodes and the cathodes; and an insulating layer disposed in spaces between adjacent transparent electrodes, the method comprising the steps of: forming the insulating organic layer; forming the organic layer; and forming of the cathode, wherein the steps of forming the insulating organic layer, the organic layer, and the cathode are carried out in a vacuum state.

Since the organic EL element of the present invention has the insulating organic layer disposed in the spaces between the adjacent transparent electrodes, a taper angle generated in the vicinity of a lateral end portion of the transparent electrode can be prevented from becoming steep, so that the organic layer and the cathode can be formed smoothly. Therefore, the cathode is prevented from breaking, and the film thickness of the organic layer is prevented from becoming thin and is uniformly formed, so that the generation of a short circuit can be also prevented.

When the insulating organic layers comprise overhanging portions to cover the lateral end portions of the transparent electrodes, even if the lateral end portions of the transparent electrodes are rough, the taper angle generated in the vicinity of the lateral end portion of the transparent electrodes can be prevented from becoming steep. Therefore, the variation of the film thickness of the organic layer, local film damage caused by an applied voltage, a short circuit caused by a concentration of an electric field, and the breaking of the cathode can be prevented.

When the overhanging portion has a taper angle at each lateral end thereof, and the thickness of the overhanging portion decreases from the inside to the outside of the insulating organic layers in the width direction of the insulating organic layer, the taper angle in the vicinity of the lateral end portions of the transparent electrodes can be prevented from becoming steep, so that the organic layer and the cathode can be formed smoothly. When the taper angle of the overhanging portion is set within the range of 0.01 to 70°, the problems described above can be prevented more effectively.

When the maximum film thickness of the insulating organic layer is set within the range of 10 to 500 nm, the cathode can be formed smoothly, so that the cathode is prevented from breaking, and the film thickness of the organic layer is prevented from becoming exceedingly thin and is uniformly formed, so that the generation of a short circuit can be also prevented.

When the insulating organic layer is made of at least one material used for the organic layer, the steps of forming the insulating organic layer, the organic layer, and the cathode, can be carried out in a vacuum state, so that the total number of manufacturing steps and the manufacturing cost can be reduced.

In the manufacturing method of the organic EL element, by forming the insulating organic layer which may be made of at least one material used for the organic layer, the generation of dark spots, which are caused by moisture generated by patterning polyimide and the like and which darken the light emission areas, can be prevented. Moreover, since all of the steps can be carried out in a vacuum state, the number of manufacturing steps and the cost for manufacturing can be reduced, in comparison with the photolithography method using polyimide.

DESCRIPTION OF THE PREFERRED EMBODIMENTS

In the following, an embodiment according to the present invention will be explained with reference to the drawings.

Figure 1:
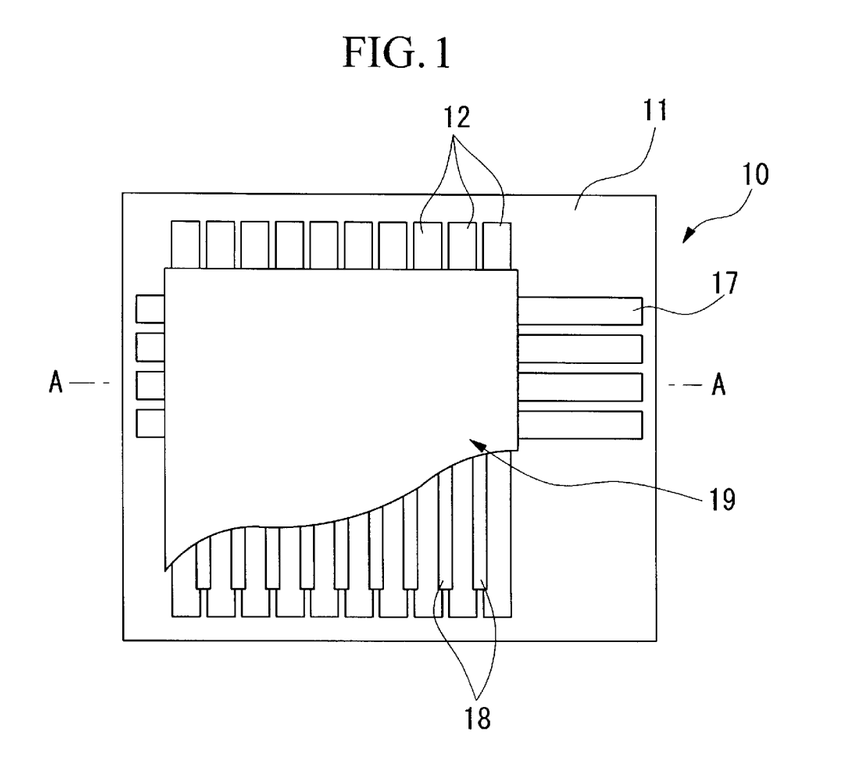
FIG. 1 is a shematic planar view showing an organic EL element of one embodiment according to the present invention.
Figure 2:
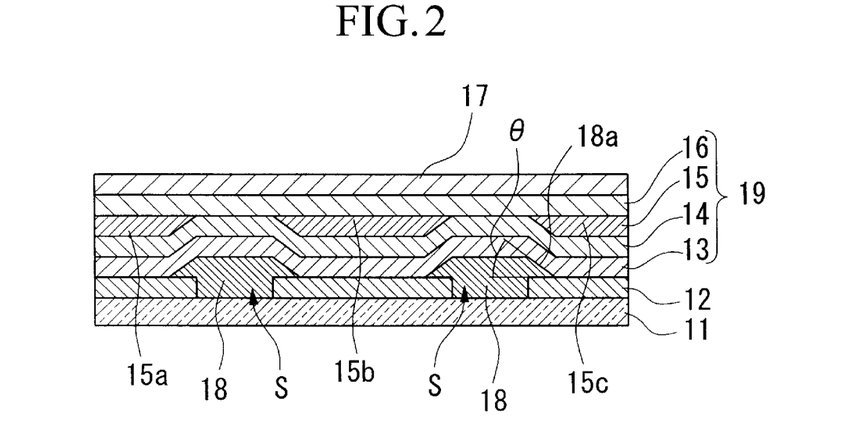
FIG. 2 is an expanded cross-sectional view of the organic EL element taken along the line A—A of FIG. 1.

As shown in FIGS. 1 and 2, in an organic EL element 10 of an embodiment according to the present invention, a plurality of transparent electrodes (anodes) 12, each having a 150 nm thickness, are arranged in parallel on a glass substrate (base plate) 11 having a 1.1 mm thickness. However, the thicknesses of the transparent electrodes (anodes) 12 and the glass substrate (base plate) 11 are not limited to the above values in the present invention.

A plurality of insulating organic layers 18 are disposed in spaces S between the adjacent transparent electrodes 12 on the glass substrate 11, so as to touch both lateral edges of the transparent electrodes 12. On the transparent electrodes 12 and the insulating organic layers 18, a hole injection layer 13 is laminated. On the hole injection layer 13, a hole transport layer 14 is laminated. On the hole transport layer 14 and above the transparent electrode 12, light emission layers 15 are laminated. On the light emission layers 15 and the hole transport layer 14, an electron transport layer 16 is laminated. On the electron transport layer 16, a plurality of cathodes 17 are patterned to form films so as to cross the transparent electrodes 12. Thus, an organic layer 19, including the hole injection layer 13, the hole transport layer 14, the light emission layers 15, and the electron transport layer 16, is formed between the transparent electrodes 12 and the cathodes 17.

A dot is formed at a crossing portion of a transparent electrode 12 and a cathode 17, and an image pixel is set to be formed by 3 RGB dots. However, the number of RGB dots required to form 1 image pixel is not limited to the above value in the present invention.

The transparent electrode (anode) 12 is generally made of an indium tin oxide (ITO). For the purpose of injecting electrons into the electron transport layer 16 with high effectiveness, the cathode 17 is preferably made of a material which has a smaller work function than that of the transparent electrode (anode) 12. Although there is no particular limitation imposed on the material used for the cathode 17, specific examples include indium, aluminum, magnesium, and an alloy or a mixed metal of magnesium-indium, magnesium-aluminum, or aluminum-lithium.

The organic layer 19 is laminated between the anodes 12 and the cathodes 17. In the organic layer 19, the light emission layers 15 are included which can emit light due to an applied voltage between the transparent electrodes 12 and the cathodes 7, and the hole injection layer 13, the hole transport layer 14, and the electron transport layer 16 are included so as to improve the efficiency of the light emission by the light emission layers 15.

The light emission layers 15 are patterned to respectively form a red light emission layer 15a, a green light emission layer 15b, and a blue light emission layer 15c, corresponding to the 3 RGB dots which form an image pixel. Although there is no particular limitation imposed on the materials used for the red light emission layer 15a, specific examples include alumi quinoline complex doped with 4-dicyanomethylene-2-methyl-6-(p-dimethylaminostyryl)-4H-pyrane (DCM, its doping concentration is preferably 5 wt %). Although there is no particular limitation imposed on the materials used for the green light emission layer 15b, specific examples include tris(8-quinolinol)aluminium (aluminium complex) doped with quinacridone (its doping concentration is preferably 5 wt %). Although there is no particular limitation imposed on the materials used for the blue light emission layer 15c, a specific example includes perylene.

Although there is no particular limitation imposed on the materials used for the hole injection layer 13, specific examples include aryl amine, such as 4,4',4"-tris(3-methylphenylphenylamino)-triphenylamine, 4-phenyl-4',4"-bis[di(3-methylphenyl)amino]triphenylamine, and triphenylamine; and diamine derivatives, such as N,N'-diphenyl-N, N'-bis(3-methylphenyl)-11'-biphenyl-4,4'-diamine (TPD), and N,N'-diphenyl-N,N'-bis($\alpha$-naphtyl)-1,1'-biphenyl-4,4'-diamine($\alpha$-NPD).

There is no particular limitation imposed on the material used for the hole transport layer 14, and any compounds that is normally used for the hole transport layer can be used; specific examples include diamines, such as bis(di(p-tolyl) aminophenyl)-1,1-cyclohexane, N,N'-diphenyl-N,N'-bis(3-methylphenyl)-1,1'-biphenyl-4,4'-diamine, and N,N'-diphenyl-N,N'-bis($\alpha$-naphtyl)-(1,1'-biphenyl)-4,4'-diamine, triamines, tetraamines, and starburst molecules.

Although there is no particular limitation imposed on the materials used for the electron transport layer 16, a specific example includes an organometallic complex, such as tris (8-quinolinol)aluminium.

As shown in FIGS. 1 and 2, the insulating organic layers 18 are formed in spaces S between the adjacent transparent electrodes 12, so as to touch both lateral edges of the transparent electrodes 12 and to have overhanging portions 18a which cover lateral end portions 12a of the transparent electrodes 12. The width of each overhanging portion may be set within the range of 1 to 15 $\mu$m.

The overhanging portion has a taper angle $\theta$ at each lateral end thereof, and the thickness of the overhanging portion 18a decreases from the inside to the outside, that is, from the spaces S to the transparent electrode, of the insulating organic layers in the width direction of the insulating organic layer 18. The taper angle $\theta$ is formed by the top surface of the transparent electrode 12 and the taper surface of the overhanging portion 18a.

The taper angle $\theta$ may be set within the range of 0.01 to 70°. When the taper angel $\theta$ is set within the range of 0.01 to 70°, the cathode 17 is more certainly prevented from breaking above the overhanging portion 18a.

The maximum film thickness of the insulating organic layer 18, that is, the film thickness in the spaces S, may be set within the range of 10 to 500 nm, and may also be set to have about the same film thickness or less than the total film thickness of the transparent electrode 12 and the light emission layer 15. Thereby, the cathodes 17 tend to be prevented from being roughly laminated at the top surface.

Although there is no particular limitation imposed on the materials used for the insulating organic layer 18, specific examples include the same materials used for the hole injection layer 13, the hole transport layer 14, and the electron transport layer 16. In this embodiment, the insulating organic layer 18 is made of the same electron transporting material used for the electron transport layer 16.

The film thickness of each layer of the organic EL element 10, except for the insulating organic layer 18 and the cathode 17, is set to be 200 nm or less.

The organic EL element 10 of this embodiment can emit light at the light emission layer 15 by merely applying a voltage between the anode 12 and the cathode 17.

Since the organic EL element 10 of this embodiment includes the insulating organic layers 18, which are disposed in the spaces S and have the overhanging portions 18a to cover the lateral end portions of the transparent electrodes 12 and the overhanging portions have taper angles at each lateral end thereof, the taper angles of the organic layer 19 above the lateral end portion 12a of the transparent electrode 12 can be prevented from becoming steep, so that the breaking of the cathode 17 can be prevented. At the same time, the transparent electrode 12 is formed uniformly, so that the film thickness of the organic layer 19 is prevented from being thin, which is caused by the roughness of the transparent electrodes 12 at the lateral end portions thereof. Moreover, the cathode 17 can be prevented from being roughly formed at the top surface. When the maximum film thickness of the insulating organic layer 18 is set to have about the same film thickness or less than the total film thickness of the transparent electrode 12 and the light emission layer 15, the cathodes 17 is prevented from being roughly laminated at the top surface. Thereby, the breaking of the cathode 17, and a short circuit between the cathode 17 and the transparent electrode 12 can be prevented, so that the reliability of the organic EL element 10 can be improved.

The organic EL element 10 of this embodiment can be prevented from having an increase in dark spots, which darken the light emission element areas and are caused by the patterning method using polyimide to prevent the breaking of the cathode 17 and a short circuit between the cathode 17 and the transparent electrode 12. This is because the organic EL element 10 is formed by laminating the insulating organic layer 18 made of the same materials as that of the other basic layers of the organic EL element 10, so that the effects of moisture, which may result in the shrinkage of pixels, can be prevented.

In the following, a manufacturing method of an organic EL element of an embodiment according to the present invention will be explained with reference to the drawings.

Figure 3A:
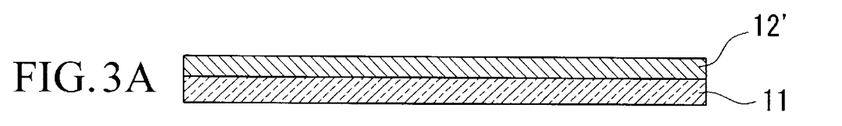
FIGS. 3A to 3D are cross-sectional views showing a manufacturing method for an organic EL element of an embodiment according to the present invention.
Figure 3B:
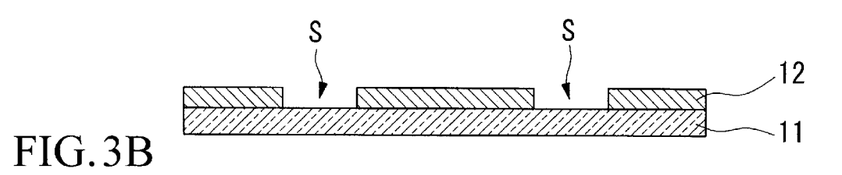
Figure 3C:
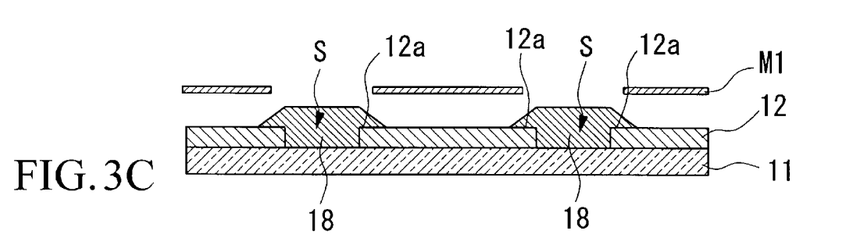

As shown in FIG. 3A, transparent electrodes 12' each having a 150 nm thickness, are formed on a glass substrate 11 having a 1.1 mm thickness by using a spatter technique. However, the thicknesses of the transparent electrodes 12' and the glass substrate 11 are not limited to the above values in this present invention. Then, a plurality of transparent electrodes 12 are patterned to form spaces S, S between the transparent electrodes 12 by using a photolithography technique, as shown in FIG. 3B. Then, the insulating organic layer 18, made of the electron transporting material described above, is formed on the lateral end portion 12a of the transparent electrode 12 and the spaces S, so as to have a film thickness of 300 nm, and include overhanging portions 18a to cover lateral end portions 12a of the transparent electrode 12, by evaporate deposition using a metal mask M1, as shown in FIG. 3C.

The taper angle $\theta$ of the overhanging portion 18a is set to 10°, for example. In order to form the taper angle $\theta$ of the overhanging portion, evaporate deposition is carried out while controlling the distance between the metal mask M1 and the base plate 11 in accordance with the taper angle $\theta$ which is set in advance. At this time, evaporate deposition particles are deposited in the spaces S and the lateral end portions 12a of the transparent electrode 12, so that the overhanging portions 18a, which have the taper angles $\theta$ at each lateral end thereof and a thickness which decreases from the inside to the outside of the insulating organic layer 18 in the width direction of the insulating organic layer 18, are automatically formed.

Moreover, the width of the overhanging portion is set to be 5 $\mu$m. The width can be determined in accordance with the slit length of the metal mask M1.

Figure 3D:
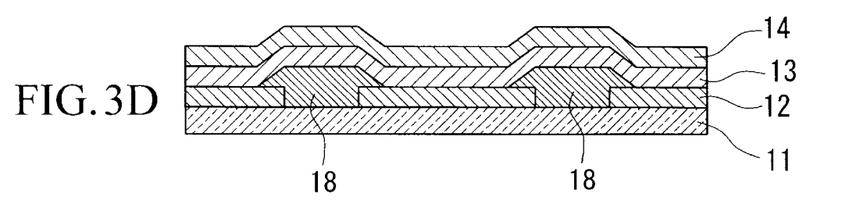
Figure 4A:
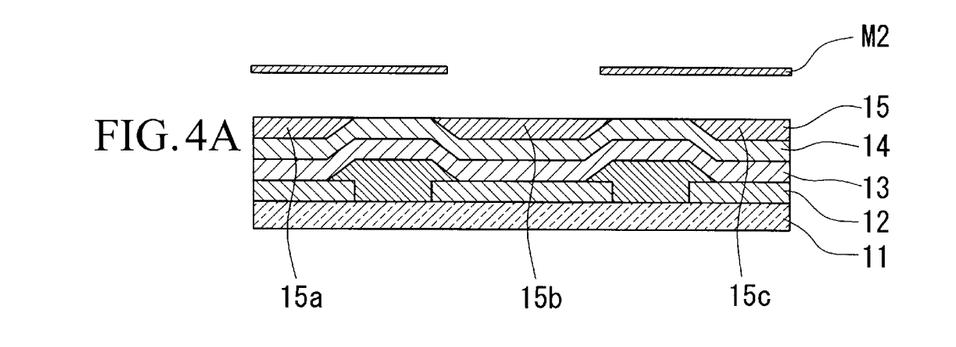
FIGS. 4A to 4B are cross-sectional views showing a manufacturing method for an organic EL element of an embodiment according to the present invention.

Then, as shown in FIG. 3D, the hole injection layer 13 and the hole transport layer 14 are formed on the transparent electrode 12 and the insulating organic layer 18, in this order, while maintaining the vacuum state. Then, as shown in FIG. 4A, the green light emission layer 15b is formed on the hole transport layer 14 above the transparent electrode 12 using a metal mask M2. In a similar manner, the red light emission layer 15a and the blue light emission layer 15c are respectively formed on the hole transport layer 14 above the transparent electrodes 12, so that the light emission layers 15 are formed into patternings.

Figure 4B:
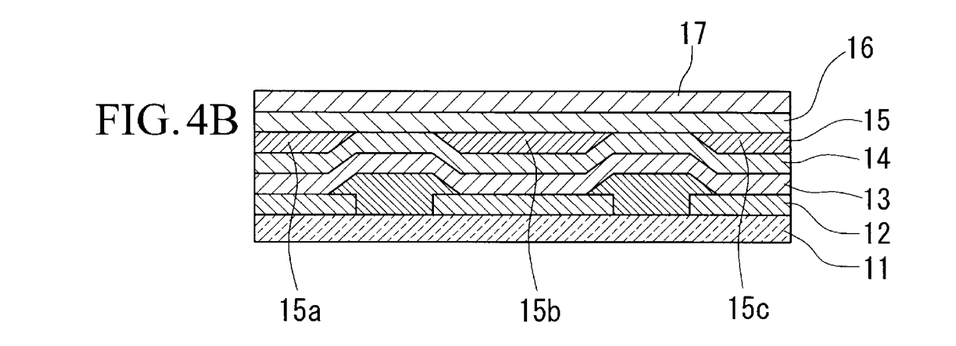

Then, as shown in FIG. 4B, the electron transport layer 16 and the cathode 17 are formed in this order, while maintaining the vacuum state. At this time, the cathodes 17, 17 are patterned to cross the transparent electrodes 12, as shown in FIG. 2.

According to this embodiment, since the insulating organic layers 18 made of the same materials as that of the electron transport layer 16 are patterned on the lateral end portions 12a of the transparent electrodes 12 and the spaces S between the adjacent transparent electrodes 12 using the metal mask M1 and the like, evaporate deposition particles are deposited on the lateral end portion 12a of the transparent electrode 12 and the spaces S, so that the overhanging portions 18a, which have the taper angle θ at each lateral end thereof and a thickness which decreases from the inside to the outside of the insulating organic layer 18 in the width direction of the insulating organic layer 18, are automatically formed; thereby, the total number of steps required for manufacturing can be reduced. Moreover, by depositing the insulating organic layers 18 on the lateral end portions 12a of the transparent electrode 12 and the spaces S, the cathode 17 is prevented from breaking, and the film thickness of the organic layer 19 is prevented form becoming thin and is uniformly formed, so that the generation of a short circuit can also be prevented.

In the organic EL element 10 according to the present embodiment, the dark spots, which are caused by a very small quantity of moisture generated in the polyimide layers provided to prevent the breaking of the cathode and the generation of a short circuit between the cathode and the transparent electrode in the patterning method using polyimide and which darken the light emission element area, can be reduced. This is because the organic EL element includes the insulating organic layer made of the same material such as that used for the organic layers and is formed in a vacuum state. Moreover, other problems caused by moisture, such as pixel shrinkage and the deterioration of the organic EL element caused by breaking the vacuum state, can be prevented.

Moreover, since the insulating organic layer can be formed in a vacuum state and is made of the same material such as that used for the organic layers, the number of manufacturing steps and the cost for manufacturing can be reduced, in comparison with the photolithography method using polyimide.

According to the organic EL element and its manufacturing method described above, the following effects can be obtained:

(1) Since the insulating organic layer is disposed between the adjacent transparent electrodes and comprises the overhanging portions to cover the lateral end portions of the transparent electrode, and each overhanging portion has a taper angle at each lateral end thereof, the taper angles of layers laminated above the transparent electrodes can be prevented from becoming steep in the vicinity of the lateral end portions of the transparent electrodes, and the breaking of the cathode can also be prevented. Moreover, even if the lateral end portions of the transparent electrodes are rough, the film thicknesses of the layers laminated above the transparent electrodes can be prevented from becoming thin, so that a short circuit between the transparent electrode and the cathode can be prevented. Thus, the reliability of the organic EL element can be improved.

(2) Since the organic EL element includes the insulating organic layer made of the same material as is used for the basic layers of the organic EL element laminated by vacuum deposition, the increase in the dark spots caused by moisture which may result in pixel shrinkage can be prevented. Since the insulating organic layer is formed in a vacuum state and is made of the same material such as is used for the basic layers of the organic EL element, the number of manufacturing steps and the cost for manufacturing can be reduced.

What is claimed is:

1. An organic electroluminescence element comprising:
   a plurality of transparent electrodes arranged in parallel on a base plate;
   a plurality of cathodes disposed above organic layers so as to cross the transparent electrodes;
   the organic layers including light emission layers and disposed between the transparent electrodes and the cathodes; and
   an insulating organic layer disposed in spaces between adjacent transparent electrodes,
   wherein the insulating organic layer has a thickness greater than a thickness of the transparent electrode.

2. An organic electroluminescence element according to claim 1, wherein the insulating organic layers comprise overhanging portions to cover lateral end portions of the transparent electrodes.

3. An organic electroluminescence element according to claim 2, wherein the maximum film thickness of the insulating organic layer is set within the range of 10 to 500 nm.

4. An organic electrolumninescence element according to claim 2, wherein the widths of the overhanging portions are set within the range of 1 to 15 μm.

5. An organic electroluminescence element according to claim 2, wherein the insulating organic layer is made of at least one material used for the organic layer.

6. An organic electroluminescence element comprising:
   a plurality of transparent electrodes arranged in parallel on a base plate;
   a plurality of cathodes disposed above organic layers so as to cross the transparent electrodes;
   the organic layers including light emission layers and disposed between the transparent electrodes and the cathodes; and
   an insulating organic layer disposed in spaces between adjacent transparent electrodes,
   wherein the insulating organic layer has a thickness greater than a thickness of the transparent electrode,
   wherein the insulating organic layers comprise overhanging portions to cover lateral end portions of the transparent electrodes, and
   wherein each overhanging portion has a taper angle at each lateral end thereof, and the thickness of the overhanging portion decreases from the inside to the outside of the insulating organic layers in the width direction of the insulating organic layer.

7. An organic electroluminescence element according to claim 6, wherein the taper angle of the overhanging portion is set within the range of 0.01 to 70°.

8. A manufacturing method of an organic electroluminescence element comprising a plurality of transparent electrodes arranged in parallel on a base plate, a plurality of cathodes disposed above organic layers so as to cross the transparent electrodes; the organic layers including light emission layers and disposed between the transparent electrodes and the cathodes, and an insulating organic layer disposed in spaces between adjacent transparent electrodes, the method comprising the steps of:

forming the insulating organic layer;

forming the organic layer; and forming the cathode, wherein the steps of forming the insulating organic layer, the organic layer, and the cathode are carried out in a vacuum state.

9. An organic electroluminescence element comprising:

a plurality of transparent electrodes arranged in parallel on a base plate;

a plurality of cathodes disposed above organic layers so as to cross the transparent electrodes;

the organic layers including light emission layers and disposed between the transparent electrodes and the cathodes; and an insulating organic layer disposed in spaces between adjacent transparent electrodes, wherein the insulating organic layers comprise overhanging portions to cover lateral end portions of the transparent electrodes, and wherein each overhanging portion has a taper angle at each lateral end thereof, and the thickness of the overhanging portion decreases from the inside to the outside of the insulating organic layers in the width direction of the insulating organic layer.

10. An organic electroluminescence element according to claim 9, wherein the taper angle of the overhanging portion is set within the range of 0.01 to 70°.

11. An organic electroluminescence element according to claim 9, wherein the maximum film thickness of the insulating organic layer is set within the range of 10 to 500 nm.

12. An organic electroluminescence element according to claim 9, wherein the widths of the overhanging portions are set within the range of 1 to 15 $\mu$m.

13. An organic electroluminescence element according to claim 9, wherein the insulating organic layer is made of at least one material used for the organic layer.

* * * * *

UNITED STATES PATENT AND TRADEMARK OFFICE
CERTIFICATE OF CORRECTION

PATENT NO. : 6,690,108 B2
DATED : February 10, 2004
INVENTOR(S) : Yoshikazu Yamaguchi et al.

It is certified that error appears in the above-identified patent and that said Letters Patent is hereby corrected as shown below:

<u>Column 8,</u>
Line 32, between the words "layer" and "has", insert -- , in all areas between adjacent transparent electrodes, --.

Signed and Sealed this

Thirteenth Day of July, 2004

JON W. DUDAS
*Acting Director of the United States Patent and Trademark Office*